(12) United States Patent
Einav

(10) Patent No.: US 8,692,107 B2
(45) Date of Patent: Apr. 8, 2014

(54) STATIONARY SOLAR SPECTRUM-SPLITTING SYSTEM AND METHOD FOR STIMULATING A BROADBAND PHOTOVOLTAIC CELL ARRAY

(75) Inventor: Moshe Einav, Kfar Uriyah (IL)

(73) Assignee: Mosaic Crystals Ltd., Herzliya Pituach (IL)

(*) Notice: Subject to any disclaimer, the term of this patent is extended or adjusted under 35 U.S.C. 154(b) by 430 days.

(21) Appl. No.: 12/935,855

(22) PCT Filed: Apr. 5, 2009

(86) PCT No.: PCT/IL2009/000371
§ 371 (c)(1),
(2), (4) Date: Nov. 19, 2010

(87) PCT Pub. No.: WO2009/122414
PCT Pub. Date: Oct. 8, 2009

(65) Prior Publication Data
US 2011/0155211 A1  Jun. 30, 2011

Related U.S. Application Data

(60) Provisional application No. 61/041,366, filed on Apr. 1, 2008.

(51) Int. Cl.
*H01L 31/052* (2006.01)
*F24J 2/06* (2006.01)
*H01L 27/30* (2006.01)

(52) U.S. Cl.
CPC ............. *H01L 31/0524* (2013.01); *F24J 2/062* (2013.01); *H01L 27/302* (2013.01)
USPC ............................. 136/246; 136/244; 136/252

(58) Field of Classification Search
CPC combination set(s) only.
See application file for complete search history.

(56) References Cited

U.S. PATENT DOCUMENTS

| 4,204,881 A | * | 5/1980 | McGrew | 136/246 |
| 6,958,868 B1 | | 10/2005 | Pender | |

(Continued)

FOREIGN PATENT DOCUMENTS

| WO | WO 2007/127103 A | 11/2007 |
| WO | WO 2007/143517 A | 12/2007 |

OTHER PUBLICATIONS

International Search Report for International Application No. PCT/IL2009/000371 mailed Mar. 12, 2010.

*Primary Examiner* — Jennifer Michener
*Assistant Examiner* — Christopher Danicic
(74) *Attorney, Agent, or Firm* — Bingham McCutchen LLP

(57) ABSTRACT

Solar system for converting solar radiation into electric energy, the system comprising: a refraction array and a converting array, the refracting array including at least one refraction sub array, each of the refraction sub arrays including a plurality of refraction sites, each of the refraction sites refracting variable approach angle collimated solar radiation into a plurality of solar rays, each of the solar rays being of a different waveband, each of the refraction sites directing each of the solar rays, refracted thereby, in a different direction, the different direction being at least dependent on the approach angle of the solar radiation, the converting array including a plurality of broadband converting cells, positioned such that light refracted by the refraction array impinges on the converting array, wherein at any given moment, each of the converting cells receives solar rays of a specific waveband originating from different refraction sites and arriving from different directions thereto.

13 Claims, 5 Drawing Sheets

(56) References Cited

U.S. PATENT DOCUMENTS

2007/0137700 A1* 6/2007 Sherohman et al. .......... 136/262
2007/0277869 A1* 12/2007 Shan et al. .................... 136/246

* cited by examiner

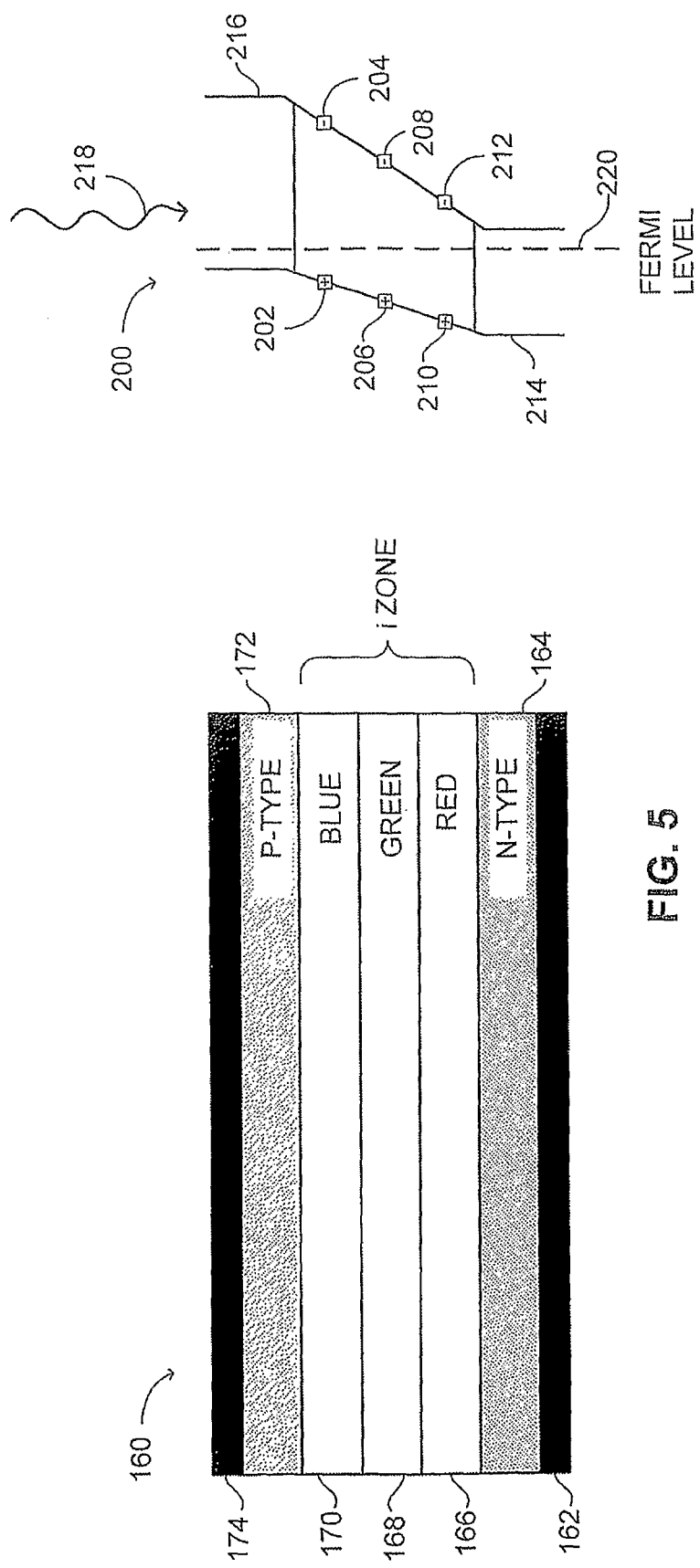

STATIONARY SOLAR SPECTRUM-SPLITTING SYSTEM AND METHOD FOR STIMULATING A BROADBAND PHOTOVOLTAIC CELL ARRAY

CROSS-REFERENCE TO RELATED APPLICATIONS

This application is a national stage application pursuant to 35 U.S.C. §371 and claims the benefit of priority under 35 U.S.C. §365 to PCT Application No. PCT/IL2009/000371 filed Apr. 5, 2009, by inventor Moshe Einav, entitled "Stationary Solar Spectrum-Splitting System and Method for Stimulating a Broadband Photovoltaic Cell Array," which claims priority to U.S. Provisional Patent Application No. 61/041,366 filed Apr. 1, 2008, the contents of which are incorporated herein in their entireties for all purposes.

FIELD OF THE DISCLOSED TECHNIQUE

The disclosed technique relates to solar conversion systems, in general, and to a stationary spectrum-splitting solar converting system having a broad range photovoltaic cell, in particular.

BACKGROUND OF THE DISCLOSED TECHNIQUE

Spectrum splitting systems for converting solar energy into electrical energy are known in the art. Incoming solar radiation is refracted by a refraction element (e.g., a prism) into a plurality of wavebands. Each of the refracted solar wavebands is directed onto a Photo-Voltaic (PV) cell. Each PV cell is designated such that it efficiently converts the respective solar waveband into electrical energy (i.e., the designated PV cell is designated for converting a specific waveband into electrical energy).

The refraction of the wavebands and the angle of the refracted rays depend on the approach angle between the incoming solar radiation and the refraction element (i.e., at a first angle of the sun the refracted rays are directed differently than at a second angle of the sun). Therefore, it is necessary to track the sun during its movement across the sky in order to maintain each of the solar wavebands directed onto the corresponding designated PV cell (i.e., the angle between the sun and the refraction element is maintained practically constant).

A PV solar cell converts solar radiation photons into electric charge carriers and transfers the charge carriers to opposite electrodes (i.e., electrons to an N-type electrode and holes to a P-type electrode). For the purpose of converting, the quantum efficiency and the possible thickness of the PV cell are dependant on the semiconductor material, of which the PV cell is constructed. The transfer of charge carriers depends on the life time (LT) of the charge carriers. The effectiveness of the PV cell increases with the LT of the charge carriers within the PV cell as detailed herein below.

In broadband PV cells and in tandem cells, there is an internal selection of wavebands in which different materials and structures within the cell absorb specific bands. When the cell has a stepwise varied band-gap width, it absorbs and converts the entire solar spectrum to electrical current with little energy losses to heat. Heat is the outcome of energy absorption when the energy of the impinging radiation is greater than the energy band gap of the PV cell material.

The materials employed for constructing broadband PV cells may be, for example, compounds of the group III-V (including Al, Ga, In, N, P, As and their solid solutions), or organic materials. The structures of these materials may be solid state bulk, quantum wells, quantum dots, amorphous, crystalline, or a combination thereof. The PV cell is conventionally constructed either as a PN junction or preferably a PIN junction.

Broadband PV cells can absorb and convert the entire solar spectrum to charge carriers, electrons and holes. Once they are generated, the charge carriers migrate toward the respective electrodes. That is, the probability of a charge carrier to reach its respective electrode increases with the charge carrier life-time. However, the charge carriers may encounter obstacles on their path to the respective electrodes. Such obstacles may be defects in the crystal, and natural counterpart (i.e., electron and hole) recombination, leading to annihilation. The effects of defects in the crystal are reduced by employing better substrates, cleaner source materials, well tuned processes and the like.

In broadband cells, as white light from the sun impinges on the cell, the cell becomes saturated with charge carriers having a broad range of energies, respective of the entire solar spectrum absorbed therein. A charge carrier drifts toward its respective electrode, according to an inner electric field of the PV cell. The probabilities of a charge carrier to reach its respective electrode without recombination decrease as the migration path is longer or as the migration path includes more counterpart carriers.

A material system is the coupling of a chemical element or compound with its microstructure. Each semiconductor material has a distinct energy absorption band-gap (BG), which allows it to absorb photons of that BG and higher. Microstructure corresponds to the geometry, structure, and space or lateral order regulating the atoms or molecules of the material.

An amorphous structure is a structure of relatively short order (i.e., on the order of 3-5 atoms). A nano-crystal or a quantum dot is a structure of a higher order than that of the amorphous structure (i.e., on the order of 20 atoms). A quantum well is a two dimensional sheet, the thickness of which is on the order of magnitude of a quantum dot. A poly-crystal is a structure of an order of hundreds of atoms in a row (e.g., 100 nm of ordered atoms). A multi-crystal is a poly-crystal of several millimeters long. It is noted that, a single crystal (i.e., mono-crystal of a few millimeters long can be cut from a multi-crystal.

Silicon, an abundant PV cell element, appears as a nano-crystal, a mono-crystal, a multi-crystal, a poly-crystal, or as an amorphous material. A single PV cell can include a combination of the above microstructures for increasing the conversion efficiency of the cell. For example, the conversion zone of a PV cell, containing nano-crystal (nc-Si) silicon grains and amorphous silicon (a-Si), is broader than that of a PV cell containing only a single microstructure. A PV cell of a-Si converts photons with energy of 1.7 eV and higher. A PV cell of combined microstructures of a-Si and nc-Si converts photons having energy of 1.15 eV and higher. Compound semiconductor systems may convert photons of higher energies (i.e., broader wavebands). A PV cell with a combination of nano-crystalline (i.e., Quantum Dots) InAs with quantum wells of GaAs, spaced by layers of AlGaAs may convert the entire solar spectrum.

A PV cell may be constructed such that each refracted solar waveband is directed to a corresponding material having similar band gap. For example, three wavebands of 200-450 nm, 450-650 nm, and 650-1000 nm are captured by three corresponding conversion zones, AlGaP having BG of 2.7 eV, GaAsP having BG of 1.85 eV, and InGaAs having BG of 1.2 eV, respectively.

One method known in the art for fitting photon waveband to material BG is horizontally splitting white light, coming from the sun, into several wavebands (e.g, blue, green, red and infra-red), and to convert each waveband with a material of corresponding BG. Another method is to apply vertical internal selection of colors. Layers of converting materials are stacked vertically, ordered according to their BG. For example, the top layer (i.e., closest to the sun) converts blue waveband, and the bottom layer (i.e., farthest away from the sun) converts IR waveband. The blue converting material layer absorbs only photons with energies higher than blue color, and allows photons with lower energies to pass through, and be absorbed in the layers underneath.

There are two main approaches known in the art for utilizing the second method described above. The first approach is the multi-junction approach (i.e., tandem cell). For example, three sub-cells or PN junctions are stacked over each other ordered according to their BG. The three sub-cells are serially connected by tunneling junctions. The current produced at individual cells passes throughout the stack and is collected at an electrode positioned at the end of the stack. The current collected by this approach is limited to the lowest current of all the sub-cells. In order to keep the currents of each of the sub-cells equal, very accurate BGs must be engineered, and the thicknesses of each sub-cell must be precise.

The second approach is to provide either a single PN or a single PIN cell in which the BG is stepwise varied, decreasing from the light receiving front. The structure of the second approach is formed by inserting quantum wells of varying thickness to a host compound semiconductor material. The quantum wells include quantum dots of a lower BG material, and are of predetermined sizes. Since the BG of each of the quantum wells is at inverse proportion to its thickness, the BG of the PV cell is stepwise varied, allowing conversion of the solar spectrum.

U.S. Pat. No. 6,015,950, issued to Converse, and entitled "Refractive Spectrum Splitting Photovoltaic Concentrator System" is directed to a solar energy conversion system. The system includes two pluralities of refracting elements (i.e., prisms) and two types of solar energy converters (i.e., a first energy converter designed to convert a first band of wavelengths, and a second energy converter designed to convert a second band of wavelengths). Each of the pluralities of refracting elements disperses oncoming broad spectrum light and redirects a portion of the spectrum of the oncoming light onto a different type of solar energy converter. Each of the solar energy converters converts the redirected portion of the spectrum, of the oncoming light, into electrical energy. The surface area of the converters is smaller than that of the pluralities of refracting elements, such that the oncoming light is focused onto the solar energy converters. A mounting arrangement holds the prism arrays and the photovoltaic cells fixed with respect to each other. The mounting arrangement tracks the sun so that the prism arrays are preferably held normal to the incident sunlight.

U.S. Pat. No. 7,206,142, issued to Wagner, and entitled "Refractive Spectrum Splitting Concentrator System" is directed to a system for concentrating and refracting electromagnetic energy having a broad energy spectrum onto bands of a target device. The system includes a Fresnel lens and a target device. The Fresnel lens refracts the electromagnetic energy. The Fresnel lens further concentrates specific wavelengths onto rectilinear bands on the target device. The target device is a solar cell. Each of the rectilinear bands on the target device corresponds to a different range of wavelengths.

US patent Application No. 2002/0003201, to Yu, entitled "Image Sensors Made From Organic Semiconductors" is directed to a multi-color image sensor made from organic semiconductors. The image sensor includes a prism or a micro-prism array, and three identical broad band photosensors. The prism is located in front of the color sensors and refracts incoming light into three colors (e.g., red, blue and green, although any other number and combination of colors is possible). Each of the identical broad-band photo sensors is a multi-layer structure of organic semi-conducting materials. Each of the three identical photo-sensors senses each of the refracted colors.

U.S. Pat. No. 6,566,595 to Suzuki, entitled "Solar Cell and Process of Manufacturing the Same", is directed to a solar cell employing a quantum dot layer in a P-I-N junction. The solar cell includes a p-type semiconductor layer and an n-type semiconductor layer made of a first compound semiconductor material. At least one quantum dot layer is formed between the P-type semiconductor layer and the N-type semiconductor layer. The quantum dot layer is constructed of a second compound semiconductor material and has a plurality of projections (i.e., quantum dots) on its surface. The quantum dots are of different sizes on a single quantum dot layer, or on any one of the quantum dot layers.

The quantum dot layer is inserted in the I-type semiconductor layer of the P-I-N junction. Thus, light of wavelength corresponding to the practical forbidden band width of the quantum dot layer is absorbed, in addition to light of wavelength corresponding to the forbidden band width of the semiconductor material forming the P-N junction. This increases the photoelectric conversion efficiency of the solar cell. The forbidden band width of the quantum dot layer can be varied depending on the combination or compound crystal ratio of the semiconductor used for forming the quantum dot layer. Thus, the wavelength range in which the photoelectric conversion can be carried out may be extended, and a solar cell which allows photoelectric conversion of varying wavelengths at high efficiency corresponding to the incident light can be manufactured. In a process of manufacturing the solar cell according to Suzuki, the quantum dot layer may be formed by lithography and selective etching, or by self-growing mechanism. The semiconductor material used for forming the quantum dot layer may be a compound of a group III element and a group V element shown in the periodic table, such as InGaAs or GaAs.

US Patent Application Pub. No. US2005/0155641 to Fafard, entitled "Solar Cell with Epitaxially Grown Quantum Dot Material", is directed to a photovoltaic solar cell having a sub-cell structure, and to a method for making such a solar cell. The solar cell is a monolithic semiconductor photovoltaic solar cells including at least one sub-cell, having a self-assembled quantum dot material. Each of the sub-cells of the solar cell exhibits a different bandgap energy value, and thus absorbs photons of different wavelengths. The sub-cells are disposed in order of increasing effective band gap energy, with the sub-cell having the lowest effective band gap energy being closest to the substrate. A barrier semiconductor layer is formed between each pair of sub-cells of the solar cell.

The method for making the solar cell includes epitaxial growth of the quantum dot material. The growth temperature of the quantum dot layers is used to adjust the shape and composition of the quantum dots. The temperature during the overgrowth of the barrier of each quantum dot layer may be varied at different stages of the overgrowth, to further control the size and composition of the quantum dots and therefore the absorption characteristics of self-assembled quantum dot material. The combination of epitaxial growth parameters is chosen to obtain quantum dot layers having a high in-plane density of highly uniform quantum dots having desired energy levels. Such growth parameters are: growth temperature, the group-V over-pressure or the III/V ratio, the quantum dot material, the amount of material used to obtain the self-assembled growth transition between a uniform quasi two-dimensional film to three-dimensional islands, the growth rate or the pauses used during the growth, and the overgrowth conditions such as growth temperature and growth rate.

A review "Spectral Beam Splitting Technology for Increased Conversion Efficiency in Solar Concentrating Systems", to A. G. Imenes and D. R. Mills, Solar Energy Materials & Solar Cells 84 (2004) 16-69, is directed at solar beam splitting systems proposed in the literature and different spectrum splitting strategies. In particular, section 4.2 of Imenes is directed to refractive and absorptive filtering methods. Imenes discloses a system including a prism, and a plurality of single-band gap cells ordered in an increasing band-gap order. The prism disperses white light and directs each of a plurality of single band light rays onto a respective cell.

SUMMARY OF THE PRESENT DISCLOSED TECHNIQUE

It is an object of the disclosed technique to provide a novel stationary spectrum-splitting solar system and method for converting solar radiation into electric energy, which overcomes the disadvantages of the prior art.

In accordance with the disclosed technique, there is thus provided a solar system for converting solar radiation into electric energy, the system including: a refraction array and a converting array. The refraction array includes at least one refraction sub-array. Each of the refraction sub-arrays includes a plurality of refraction sites. Each of the refraction sites refracts variable approach-angle collimated solar radiation into a plurality of solar rays. Each of the solar rays is of a different waveband. Each of the refraction sites directs each of the solar rays, refracted thereby, in a different direction. The different direction is at least dependent on the approach-angle of the solar radiation.

The converting array includes a plurality of broadband converting cells. The converting cells are positioned such that light refracted by the refraction array impinges on the converting array. At any given moment, each of the converting cells receives solar rays of a specific waveband originating from different refraction sites and arriving from different directions thereto.

In accordance with another embodiment of the disclosed technique there is thus provided a method for converting solar radiation into electrical energy. The method includes the procedures of: refracting variable approach-angle collimated solar radiation into a plurality of solar rays; directing each of the solar rays; receiving the refracted solar rays by a plurality of broadband converting cells; and converting by each of the converting cells, the specific waveband refracted solar rays, received thereby, into electrical energy.

The procedure of refracting is achieved at each of a plurality of refraction sites, composing a refraction array. Each of the solar rays is of a different waveband. The procedure of directing is achieved for each solar ray at the respective refraction site. The direction of each solar ray is at least dependant on the approach-angle of the collimated solar radiation. The procedure of receiving the refracted solar rays is achieved by a plurality of broadband converting cells. Each of the converting cells is located so as to receive refracted solar rays of a specific waveband, originating at different refraction sites and arriving from different directions.

BRIEF DESCRIPTION OF THE DRAWINGS

The disclosed technique will be understood and appreciated more fully from the following detailed description taken in conjunction with the drawings in which:

FIG. 5 is a schematic illustration of a P-I-N PV cell, constructed and operative in accordance with a further embodiment of the disclosed technique; and FIG. 6 is an energy scheme of the P-I-N PV cell of FIG. 5.

DETAILED DESCRIPTION OF THE EMBODIMENTS

The disclosed technique overcomes the disadvantages of the prior art by employing a refracting array (e.g., a prism array) for refracting (i.e., splitting) incoming solar radiation into a plurality of groups of solar rays, at multiple refraction sites thereon. Each of the groups includes solar rays of a single waveband (i.e., a first group includes solar rays of a first waveband—for example a red waveband, and a second group includes rays of a second waveband—for example a blue waveband). An array of identical broadband converting cells converts the solar radiation into electrical energy. Each of the identical converting cells receives solar rays belonging to a single group of solar rays for a given approach angle of the solar radiation.

The solar system can be stationary and does not need to track the sun across the sky. Thus, the approach angle between the sun and the stationary solar system may change. The refracting array refracts the solar radiation into the same groups of solar rays for all angles of the sun (e.g., the refracting array refracts the solar radiation into a group of blue rays and a group of red rays for every angle of the sun). However, the refracting array directs the solar rays onto the array of identical converting cells according to the approach angle. Hence, each of the converting cells receives solar rays of a different waveband at different approach angles (e.g., during different times of the day). Alternatively, the solar system is mounted on a tracking system that tracks the sun. The tracking system maintains the angle between the sun and the solar system at a predetermined range (e.g., the tracking system maintains the angle between the normal to the refraction array of the solar system and the sun below 40 degrees).

According to the disclosed technique, the inherent problem of recombination of charge carriers is reduced, by directing narrow waveband light onto each broadband PV cell, absorbing only a narrow waveband of photons in only a thin layer of the cell, at a time. Thus, the generated charge carriers encounter no natural counterpart to recombine with, on their migration path. By exciting the broadband cell with a narrow waveband of solar radiation, the charge carriers have a counterpart-free path toward the respective electrodes, thereby reducing the recombination losses, and increasing the conversion efficiency.

Figure 1A:
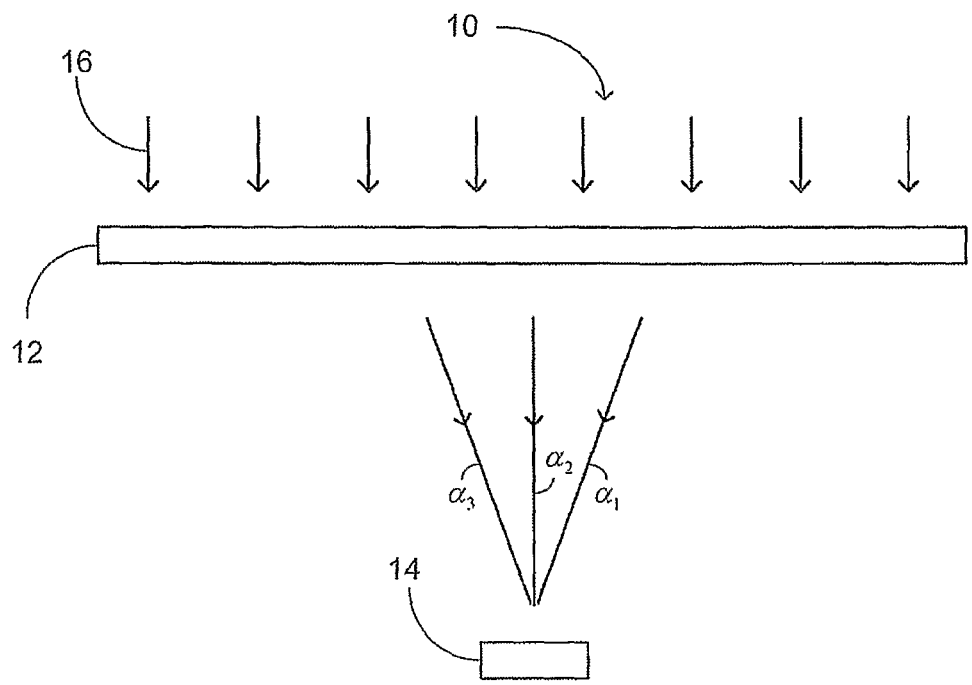
FIG. 1A is a schematic illustration of a spectrum-splitting stationary solar system, in which solar radiation impinges at a first angle on a refraction array, constructed and operative in accordance with an embodiment of the disclosed technique.
Figure 1B:
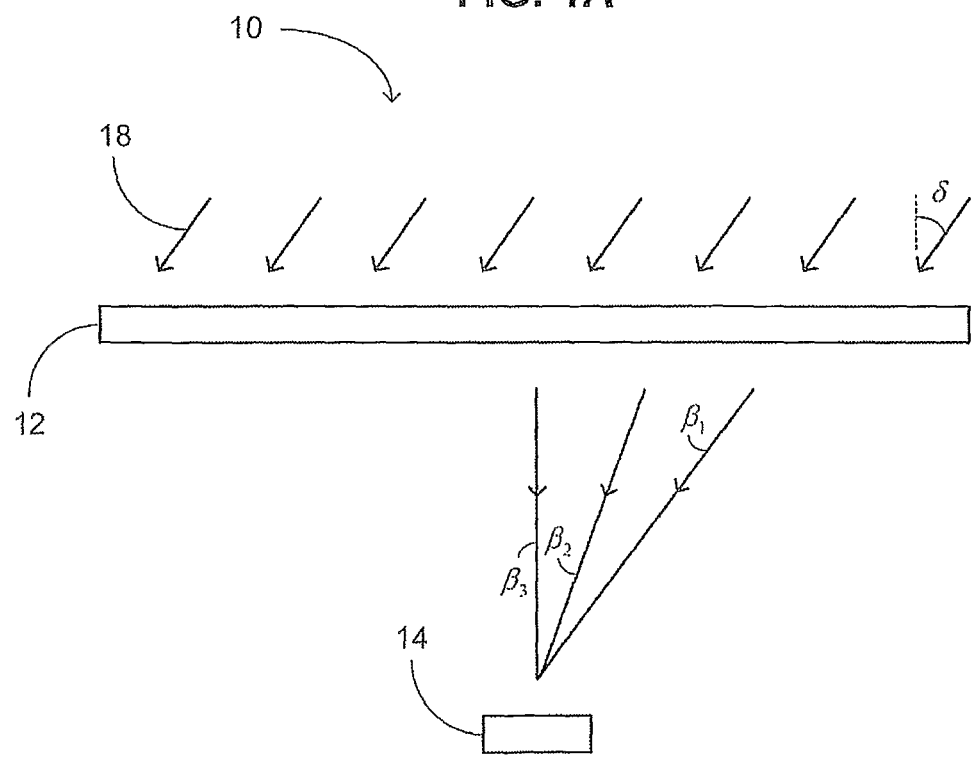
FIG. 1B is a schematic illustration of the spectrum-splitting stationary solar system of FIG. 1A, in which solar radiation impinges at a second angle on the refraction array.

Reference is now made to FIGS. 1A, and 1B. FIG. 1A is a schematic illustration of a spectrum-splitting stationary solar system, generally referenced 10, in which collimated solar radiation impinges at a first angle on a refraction array, constructed and operative in accordance with an embodiment of the disclosed technique. FIG. 1B is a schematic illustration of the spectrum-splitting stationary solar system of FIG. 1A, in which collimated solar radiation impinges at a second angle on the refraction array.

With reference to FIG. 1A, spectrum-splitting stationary solar system 10 includes a refraction array 12, and a broadband converting cell 14. Converting cell 14 is positioned relative to refraction array 12, such that light refracted by refraction array 12 impinges on converting cell 14. Collimated solar radiation 16 impinges on refraction array 12. The refraction index of refraction array 12 changes periodically along the length of refraction array 12. Refraction array 12 refracts solar radiation 16 and directs a first group of rays $\alpha_1$, $\alpha_2$, and $\alpha_3$, originating from different locations (i.e., different refraction sites) along refraction array 12, onto converting cell 14. Rays $\alpha_1$, $\alpha_2$, and $\alpha_3$ are all of the same waveband (e.g., blue light).

Refraction array 12 can be any known optical element which separates incoming broadband light into rays of different wavebands. For example, refraction array 12 is an array of prisms (for further example, an array of right angled triangular prisms is elaborated with reference to FIG. 4). Another example of refraction array 12 is a grated surface. Yet another example of refraction array 12 is a group of refracting layers, each of the layers having a refraction index different than the neighboring layer, the layers are ordered according to the refraction index thereof. It is noted, that the disclosed technique can employ any spectrum splitting systems and methods known in the art. A review of spectrum splitting systems and methods is detailed herein above with relation to Imenes et al. ("Spectral Beam Splitting Technology for Increased Conversion Efficiency in Solar Concentrating Systems", 2004), which is incorporated herein by reference.

Converting cell 14 is a broad-band PV cell which can absorb broad-band solar radiation and convert it into electrical energy. For example, converting cell 14 is a PIN junction converting cell, as detailed further with reference to FIG. 4. Another example of broadband converting cell 14 is a PN junction converting cell. Yet other examples of broadband converting cell 14 are a tandem cell, a photovoltaic multi-junction converting cell, and an excitonic-based converting cells. It is noted that, broadband PV cell can include quantum dots, quantum wells, or both (e.g., a PN junction PV cell having quantum wells, a PIN junction PV cell having quantum wells and quantum dots).

With reference to FIG. 1B, collimated solar radiation 18 impinges on system 10 at an angle δ, relative to the first angle, depicted in FIG. 1A. Solar system 10 is stationary, such that when the sun moves across the sky, the approach angle of the solar radiation changes accordingly. Refraction array 12 refracts collimated solar radiation 18 and directs a second group of rays $\beta_1$, $\beta_2$, and $\beta_3$, toward converting cell 14. Solar rays $\beta_1$, $\beta_2$, and $\beta_3$, originate from different refraction sites along refraction array 12, onto converting cell 14. Rays $\beta_1$, $\beta_2$, and $\beta_3$ are all of the same waveband (e.g., green light). The second group of rays is of a different waveband than the first group of rays, refracted for the first angle. For each different approach angle of the solar radiation, a group of solar rays of a different waveband impinges on converting cell 14.

Figure 2A:
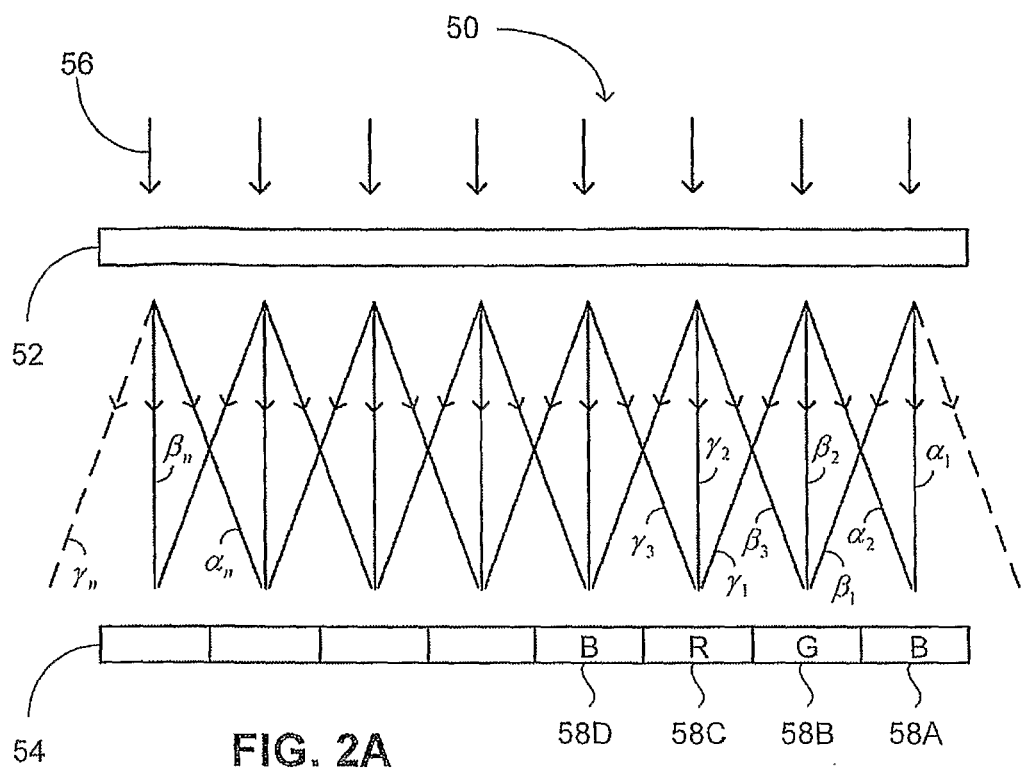
FIG. 2A is a schematic illustration of a spectrum-splitting stationary solar system, wherein the solar radiation impinges on the solar system at a first angle, constructed and operative in accordance with another embodiment of the disclosed technique.
Figure 2B:
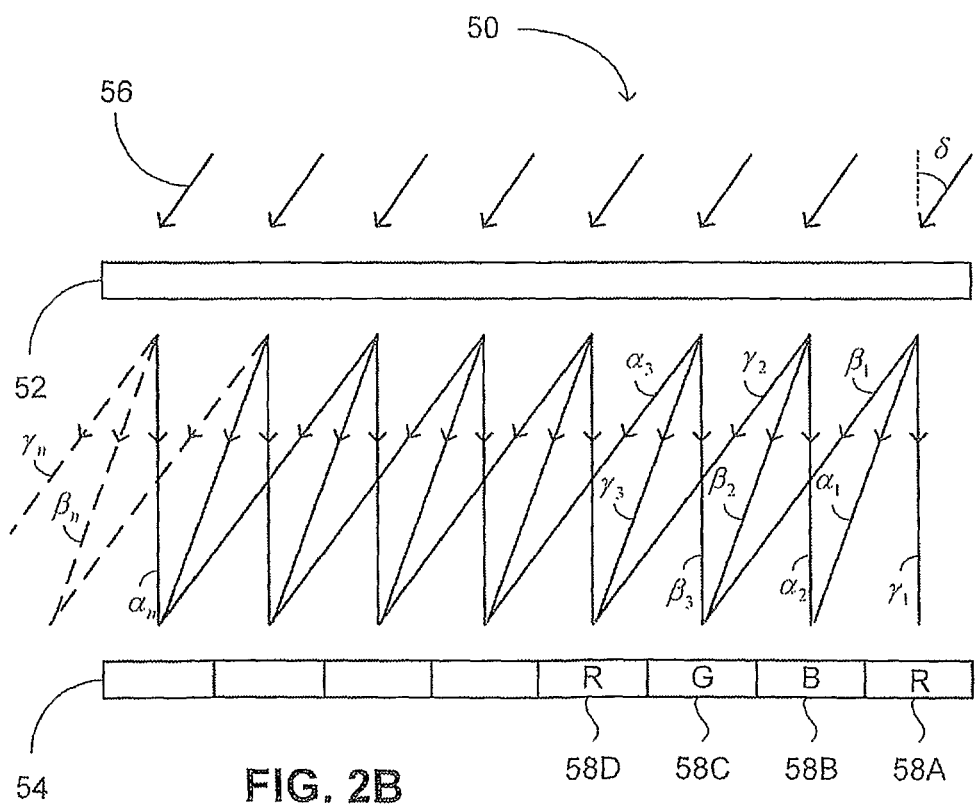
FIG. 2B is a schematic illustration of the spectrum-splitting stationary solar system of FIG. 2A, wherein the solar radiation impinges on the solar system at a second angle, $\delta$.

Reference is now made to FIGS. 2A and 2B. FIG. 2A is a schematic illustration of a spectrum-splitting stationary solar system, generally referenced 50, wherein the collimated solar radiation impinges on the solar system at a first angle, constructed and operative in accordance with another embodiment of the disclosed technique. FIG. 2B is a schematic illustration of the spectrum-splitting stationary solar system of FIG. 2A, wherein the collimated solar radiation impinges on the solar system at a second angle δ.

With reference to FIG. 2A, solar system 50 includes a refraction array 52 and a converting array 54. Converting array 54 is positioned opposite to refraction array 52, such that light refracted by refraction array 52 impinges on converting array 54. Refraction array 52 is substantially similar to refraction array 12 of FIGS. 1A and 1B. Converting array 54 includes a plurality of identical broadband converting cells 58A, 58B, 58C, and 58D, substantially similar to converting cell 14 of FIGS. 1A and 1B.

Collimated solar radiation 56 impinges on refraction array 52, at a substantially normal first angle. Refraction array 12 refracts solar radiation 56 into three groups of solar rays. A first group of solar rays $\alpha_1, \alpha_2 \ldots, \alpha_n$, all of the rays of the first group are of a specific waveband (e.g., blue light, 400-500 nm). A second group of solar rays $\beta_1, \beta_2 \ldots, \beta_n$, all of the rays of the second group are of a specific waveband (e.g., green light, 500-600 nm). A third group of solar rays $\gamma_1, \gamma_2 \ldots, \gamma_n$, all of the rays of the third group are of a specific waveband (e.g., red light, 600-700 nm).

Each of solar rays $\alpha_1, \alpha_2 \ldots, \alpha_n$ of the first group originate from a different refraction site (e.g., a different prism, as detailed in FIG. 4) along refraction array 52. Each of the rays $\beta_1, \beta_2 \ldots, \beta_n$ of the second group originate at a different refraction site along refraction array 52. Each of the rays $\gamma_1, \gamma_2 \ldots, \gamma_n$ of the third group originate at a different refraction site along refraction array 52.

Refraction array 52 further directs the three groups of solar rays (i.e., the group of α solar rays, the group of β solar rays, and the group of γ solar rays) toward converting array 54. The direction of each refracted solar ray depends on the approach angle (e.g., angle δ in FIG. 2B) of solar radiation 56.

Each of converting cells 58A, 58B, 58C, and 58D of converting array 54 receives rays of a specific waveband. That is, each of converting cells 58 receives solar rays of one of the three groups, from refraction array 52. The specific waveband of the solar rays, impinging on each of converting cells 58A, 58B, 58C, and 58D depends on the direction of each of the refracted solar rays, and as such depends on the approach angle of solar radiation 56.

In the example set forth in FIG. 2A, converting cell 58A receives solar rays $\alpha_1$, $\alpha_2$, of the first group (e.g., blue waveband), converting cell 58B receives solar rays $\beta_1$, $\beta_2$, and $\beta_3$ of the second group (e.g., green waveband), and converting cell 58C receives solar rays $\gamma_1$, $\gamma_2$, and $\gamma_3$ of the third group (e.g., red waveband). It is noted, that solar radiation 56 may either impinge directly on refraction array 52, or be reflected onto refraction array 52 by a reflection element (not shown), such as a mirror, a concentrating mirror, and the like.

With reference to FIG. 2B, collimated solar radiation 56 impinges on refraction array 52 at an angle δ, relative to the first angle (i.e., the angle of FIG. 2A). Refraction array 52 refracts solar radiation 56 into the three groups of solar rays α, β, and γ (i.e., the same three groups of solar rays as in FIG. 2A). Refraction array 52 directs each of the solar rays onto converting array 54. The direction of each solar ray depends on the approach angle (e.g., angle δ) of solar radiation 56.

Each of converting cells 58 receives solar rays of a specific waveband (i.e., solar rays of a specific group). In the example set forth in FIG. 2B, converting cell 58A receives solar ray $\gamma_1$, belonging to the third group (e.g., red waveband), converting cell 58B receives solar rays $\alpha_1$ and $\alpha_2$ belonging to the first group (e.g., blue waveband), and converting cell 58C receives solar rays $\beta_1$, $\beta_2$, and $\beta_3$ belonging to the second group (e.g., green waveband).

It is noted, that since each of converting cells 58 converts solar rays of a specific waveband at a given approach angle, the conversion of solar radiation is more efficient, as detailed with respect to FIGS. 5 and 6. It is further noted, that the number of groups of solar rays (e.g., three, in the example set forth in FIGS. 2A and 2B) can be any number larger than two, and is not limited to the number set forth as example in FIGS. 2A and 2B.

Figure 3:
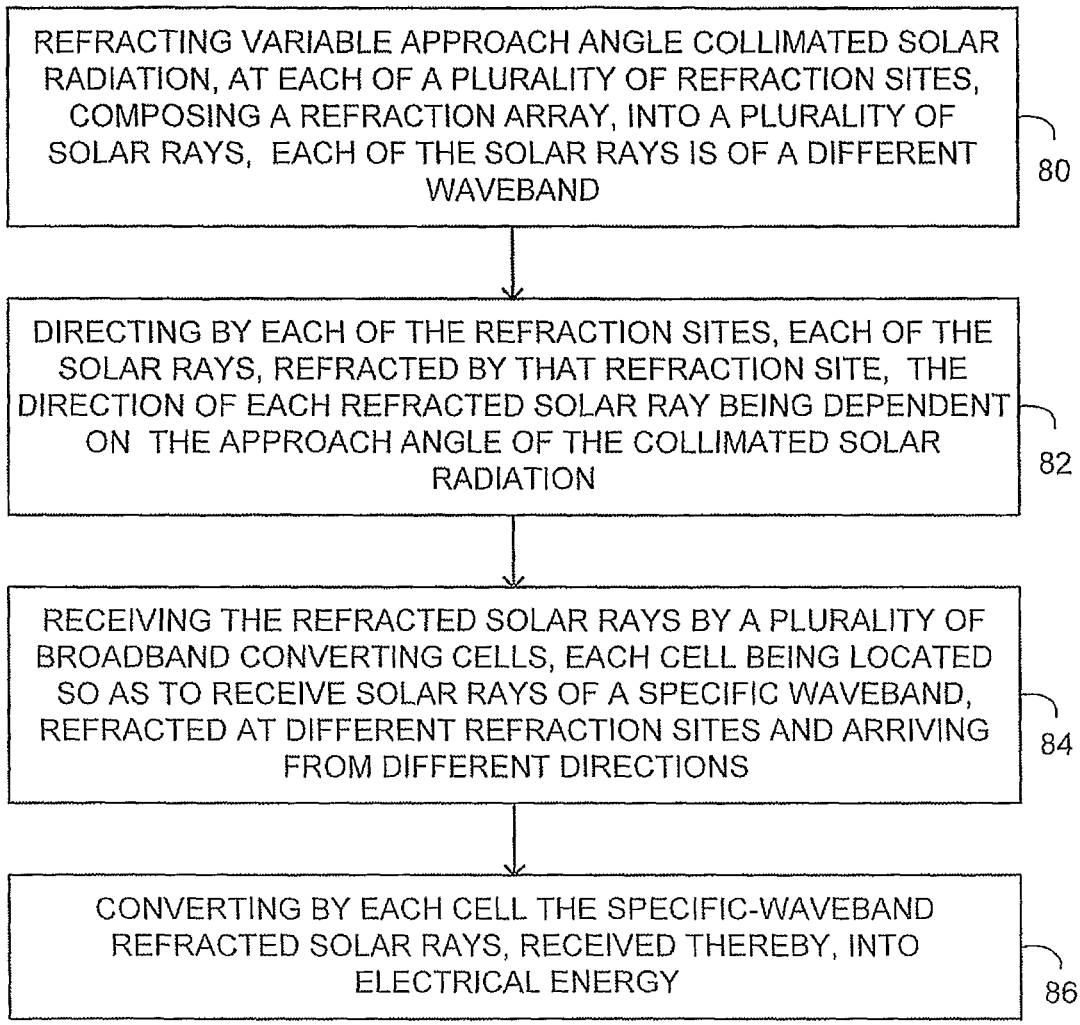
FIG. 3 is a schematic illustration of a method for refracting and converting the solar radiation, operative in accordance with a further embodiment of the disclosed technique.

Reference is now made to FIG. 3, which is a schematic illustration of a method for refracting and converting the solar radiation, operative in accordance with a further embodiment of the disclosed technique. In procedure 80, variable approach-angle collimated solar radiation is refracted at each of a plurality of refraction sites into a plurality of solar rays. The refraction sites are composing a refraction array. Each of the solar rays, refracted by a single refraction site, is of a different waveband. The spectrum of refracted wavebands is similar for all the refraction sites (e.g., all of the refraction sites refract the solar radiation into the same separate wavebands).

Figure 4:
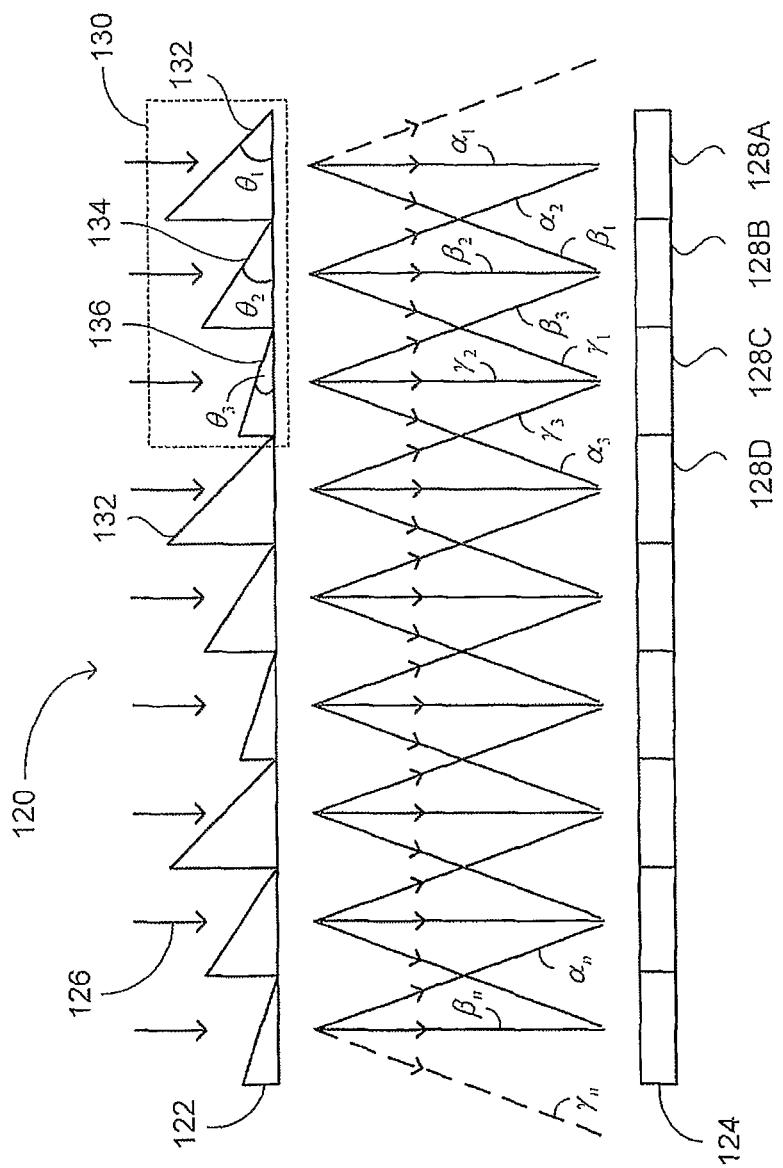
FIG. 4 is a schematic illustration of a spectrum-splitting solar system, constructed and operative in accordance with another embodiment of the disclosed technique.

With reference to FIG. 4, prism 134 refracts solar radiation 126 into three solar rays $\alpha_2$, $\beta_2$, and $\gamma_1$. Each of solar rays $\alpha_2$, $\beta_2$, and $\gamma_1$ is of a different waveband (e.g., $\alpha_2$—blue, $\beta_2$—green, and $\gamma_1$—red). Prism 136 refracts solar radiation 126 into three solar rays $\beta_3$, $\beta_2$, and $\alpha_3$. Solar ray $\beta_3$ is of the same waveband as solar ray $\beta_2$ (e.g., green), refracted by prism 134. Solar ray $\gamma_2$ is of the same waveband as solar ray $\gamma_1$ (e.g., red), refracted by prism 134. Solar ray $\alpha_3$ is of the same waveband as solar ray $\alpha_2$ (e.g., blue), refracted by prism 134.

In procedure 82, each of the solar rays, refracted by a refraction site, is directed by that refraction site. The direction of each of the solar rays depends on the approach angle of the solar radiation. With reference to FIG. 4, prism 134 directs solar ray $\alpha_2$ into a first direction (e.g., toward cell 128A), solar ray $\beta_2$ into a second direction (e.g., toward cell 128B), and solar ray $\gamma_1$ into a third direction (e.g., toward cell 128C). The first, second, and third directions depend on the approach angle of solar radiation 126. For example, for a second approach angle δ, prism 134 directs solar ray $\alpha_2$ into the second direction—toward cell 128B, solar ray $\beta_2$ into the third direction—toward cell 128C, and solar ray $\gamma_1$ into a fourth direction—toward cell 128D.

In procedure 84, each of a plurality of broadband converting cells receives refracted solar rays. Each broadband converting cell is located so as to receive solar rays of a specific waveband. Each converting cell receives solar rays refracted at different refraction sites and therefore, arriving from different directions. With reference to FIG. 4, converting cell 128A receives two solar rays, $\alpha_1$ and $\alpha_2$, of a specific waveband (e.g., blue). Solar rays $\alpha_1$ and $\alpha_2$ are refracted by prisms (i.e., refraction sites) 132 and 134, respectively, and therefore arrive from different directions towards cell 128A. Converting cell 128B receives three solar rays $\beta_1$, $\beta_2$, and $\beta_3$, of a specific waveband (e.g., green). Solar rays $\beta_1$, $\beta_2$, and $\beta_3$ are refracted by prisms 132, 134, and 136, respectively, and therefore arrive from different directions towards cell 128B.

In procedure 86, each converting cell converts the specific waveband refracted solar rays, received thereby, into electrical energy. With reference to FIG. 4, converting cell 128A converts solar rays $\alpha_1$ and $\alpha_2$, into electrical energy. Converting cell 128B converts solar rays $\beta_1$, $\beta_2$, and $\beta_3$, into electrical energy.

Reference is now made to FIG. 4, which is a schematic illustration of a spectrum-splitting solar system, generally referenced 120, constructed and operative in accordance with another embodiment of the disclosed technique. Solar system 120 includes a refraction array 122, and a converting array 124. Converting array 124 is positioned relative to refraction array 122, such that light refracted by refraction array 122 impinges on converting array 124. It is noted, that refraction array 122 and converting array 124 can be coupled together, such that they form a single structure. Alternatively, a transparent medium (not shown) is positioned between refraction array 122 and converting array 124.

Refraction array 122 is composed of a plurality of identical refraction sub-arrays 130. Each of identical refraction sub-arrays 130 is composed of three refracting triangular right angled prisms 132, 134, and 136. The hypotenuse of each of triangular prisms 132, 134, and 136, is different. Thus, the internal angle of each triangular prism is different. The internal angles of prisms 132, 134, and 136 are $\theta_1$, $\theta_2$, and $\theta_3$, respectively.

Converting array 124 includes a plurality of identical broad-band converting cells 128A, 128B, 128C, and 128D. Each of converting cells 128 A, 128B, 128C, and 128D is substantially similar to converting cell 14 of FIGS. 1A and 1B. It is noted, that converting array 124 can be micro-converting array, in which each identical converting cell 128 has a surface area of a few microns. It is further noted, that converting array 124 can include a single converting cell. Each spatial section (not shown) of single converting cell 124 receives solar rays of a specific waveband, refracted by refracting array 122. In other words, the partitioning of array 124 into cells 128A, 128B, 128C, and 128D is not essential for the functionality of the disclosed system.

Refracting array 122 refracts solar radiation 126 in a manner substantially similar to that of refracting array 52 of FIGS. 2A and 2B. Prism 132 refracts solar radiation 126 into two solar rays $\alpha_1$ and $\beta_1$ (i.e., two solar rays which remain within the boundaries of solar system 120, and a third solar ray which is directed outside of solar system 120). The direction of each of solar rays $\alpha_1$, and $\beta_1$, depends on the angle of approach of solar radiation 126 (e.g., solar radiation 126 is normal to refraction array 122). Prism 132 directs each of solar rays $\alpha_1$, and $\beta_1$ onto a each of converting cells 128A, and 128B, respectively.

Prism 134 refracts solar radiation 126 into three solar rays $\alpha_2$, $\beta_2$, and $\gamma_1$. The direction of each of solar rays $\alpha_2$, $\beta_2$, and $\gamma_1$ depends on the approach angle of solar radiation 126. Prism 134 directs each of solar rays $\alpha_2$, $\beta_2$, and $\gamma_1$ toward each of converting cells 128A, 128B, and 128C, respectively.

Prism 136 refracts solar radiation 126 into three solar rays $\beta_3$, $\gamma_2$, and $\alpha_3$. The direction of each of solar rays $\beta_3$, $\gamma_2$, and $\alpha_3$ depends on the approach angle of solar radiation 126. Prism 136 directs each of solar rays $\beta_3$, $\gamma_2$, and $\alpha_3$ toward each of converting cells 128B, 128C, and 128D, respectively.

It is noted, that the number of types of refraction sites determines the number of groups of refracted solar rays. In the example set forth in FIG. 4, there are three types of refraction sites (i.e., three types of triangular prisms 132, 134, and 136) and accordingly, three groups of solar rays (i.e., a first group of α solar rays, a second group of β solar rays, and a third group of γ solar rays). It is further noted, that refraction array 122 is constructed periodically (i.e., prisms 132 are identical, since refraction sub-array 130 repeats within refraction array 122).

Converting cell 128A receives solar rays $\alpha_1$ and $\alpha_2$ from prisms 132 and 134, respectively. Converting cell 128A receives solar rays of a specific waveband (i.e., both $\alpha_1$ and $\alpha_2$ are of a specific waveband, for example blue). The waveband of the solar rays impinging on converting cell 128A depends on the approach angle of solar radiation 126 (e.g., for a different approach angle of solar radiation 126, converting cell 128A would receive solar rays $\beta_1$, $\beta_2$, and $\beta_3$, all of a specific waveband different from the waveband of solar rays $\alpha_1$ and $\alpha_2$). Converting cell 128B receives solar rays $\beta_1$, $\beta_2$, and $\beta_3$ from prisms 132, 134, and 136, respectively. Converting cell 128C receives solar rays $\gamma_1$, $\gamma_2$ and $\gamma_3$ from prisms 134, 136 and 132 (i.e., prism 132 on the left of prism 136), respectively.

In the example set forth in FIG. 4, prism 134 directs each of solar rays $\alpha_2$, $\beta_2$, and $\gamma_1$, toward each of three converting cells 128A, 128B, and 128C, respectively. In case solar radiation 126 impinges prism 134 at a second angle δ, prism 134 directs each of solar rays $\alpha_2$, $\beta_2$, and $\gamma_1$, toward each of three other converting cells (e.g., 128B, 128C, and 128D, respectively).

Alternatively, prism 134 directs each of solar rays $\alpha_2$, $\beta_2$, and $\gamma_1$, toward each of the same three solar cells for every approach angle of solar radiation 126. For example, prism 134 directs solar rays $\alpha_2$, $\beta_2$, and $\gamma_1$, toward converting cells 128A, 128B, and 128C, respectively for a first approach angle of solar radiation 126. Prism 134 directs solar rays $\alpha_2$, $\beta_2$, and $\gamma_1$, toward converting cells 128B, 128C, and 128A, respectively for a second approach angle of solar radiation 126. Prism 134 directs solar rays $\alpha_2$, $\beta_2$, and $\gamma_1$, toward converting cells 128C, 128A, and 128B, respectively for a third approach angle of solar radiation 126.

Reference is now made to FIG. 5, which is a schematic illustration of a P-I-N PV cell, generally referenced 160, constructed and operative in accordance with a further embodiment of the disclosed technique. It is noted, that P-I-N PV cell 120 is an example of converting cell 58 (FIG. 2A), and other broad-band PV cells might be employed by the disclosed technique. PV cell 160 includes a sequence of semiconducting material (e.g., Galium Nitride (GaN)) layers 164, 166, 168, 170, and 172, stacked between a first electrode 162 on the one end thereof, and a second electrode 174 on the other end thereof.

GaN layer 164, which is doped with n-type material (hereinafter, n-type layer 164), is stacked between first electrode 162 and GaN layer 166. InGaN layer 166 is constructed to convert solar rays of a red color waveband into electrical energy (hereinafter, red layer 166). InGaN layer 168 (hereinafter, green layer 168), is constructed to convert solar rays of a green color waveband into electrical energy. Green layer 168 is stacked between red layer 166 and GaN layer 170. InGaN layer 170 is constructed to convert solar rays of a blue color waveband into electrical energy (hereinafter, blue layer 170). GaN layer 172, which is doped with p-type material (hereinafter, p-type layer 172), is stacked between blue layer 170 and second electrode 174. Red layer 166, green layer 168 and blue layer 170 form the I-zone of P-I-N PV cell 160.

Each of red layer 166, green layer 168, and blue layer 170 may exhibit different composition of In and Ga, according to the desired function of P-I-N PV cell 160. Although in the example set forth in FIG. 4 P-I-N PV cell 160 includes only three colored layers, it is noted that it may include any other number of colored layers, according to the design and operational requirements thereof (i.e., since every InGaN layer is constructed to convert a different waveband of solar energy).

First electrode 162 and second electrode 174 are coupled to each end of the P-I-N junction. When P-I-N PV cell 160 is connected to an external circuit, an electric current is generated between first electrode 162 and second electrode 174.

For example, with reference to FIG. 2A, P-I-N PV cell 160 may be employed as each of converting cells 58. It would be appreciated, that although P-I-N PV cell 160 may convert the broad spectrum solar radiation, only a single waveband impinges thereon for a given approach angle of the solar radiation, as set forth for example in FIG. 2A. Thus, charge carriers are formed at a relatively small portion of the I-zone of the P-I-N PV cell 160. That is, because charge carriers are formed only at a single InGaN layer of the PV cell, for every approach angle of the solar radiation. The other layers of P-I-N PV cell 160 (i.e., layers not converting solar radiation for the current approach angle) are substantially free of charge carriers. In this manner, the migration of the newly formed charge carriers, toward the respective electrodes, is less interrupted (i.e., the lifetime of the charge carrier is longer, thereby increasing the efficiency of the solar cell). It is noted, that PV cell 160 can be constructed of any material, such as crystalline, amorphous, organic synthetic, or mixed phase material.

A broadband PV cell constructed of amorphous material layers is described in U.S. Provisional Patent Application No. 60/989,334 to Einav, entitled "Amorphous Group-III Metal Nitride and Preparation Thereof". Such a solar cell may be employed as a broad band solar cell in the converting array of the disclosed technique (e.g., PV cell 58 of FIGS. 2A and 2B). It is noted, that in the example set forth in FIG. 5, solar cell 160 receives the solar radiation from the direction of the P-type layer. Alternatively, solar cell 160 is constructed such that the solar radiation is approaching solar cell 160 from the direction of the N-type layer.

Reference is now made to FIG. 6, which is an energy scheme, generally referenced 200, of the P-I-N PV cell of FIG. 5. Energy scheme 200 includes a valence band 214, a conductance band 216, an impinging photon 218 (i.e., an impinging light ray), a blue hole 202, a blue electron 204, a green hole 206, a green electron 208, a red hole 210, and a red electron 212. Energy scheme 200 describes the photoelectric effect occurring at PV cell 160 (FIG. 5) when a photon impinges on PV cell 160.

A first example of the photoelectric effect occurs when a blue photon 218 (e.g., photon having wavelength of approximately 400 nm) impinges on PV cell 160. Blue layer 170 absorbs blue photon 218. A respective blue electron 204 and a respective blue hole 202 (i.e., an electron and a hole having energy similar to that of blue photon 218) are generated by the photoelectric effect. Blue electron 204 travels toward electrode 162 by the electric field applied by the P-I-N junction. Blue hole 202 travels toward electrode 174 by the electric field applied by the P-I-N junction.

A second example of the photoelectric effect occurs when a green photon 218 (e.g., photon having wavelength of approximately 525 nm) impinges on PV cell 160. Green photon 218 goes through blue layer 170 without exciting any of the atoms (i.e., the photoelectric effect does not take place at blue layer 170, since green photon 218 does not posses enough energy to excite the atoms of blue layer 170). Green layer 168 absorbs green photon 218. A respective green electron 208 and a respective green hole 206 (i.e., an electron and a hole having energy similar to that of green photon 218) are generated by the photoelectric effect. Green electron 208 travels towards electrode 162 by the electric field applied by the P-I-N junction (FIG. 5). Green hole 206 travels towards electrode 174 by the electric field applied by the P-I-N junction.

A third example of the photoelectric effect occurs when a red photon 218 (e.g., photon having wavelength of approximately 650 nm) impinges on PV cell 160. Red photon 218 travels through blue layer 170 and green layer 168 without exciting any of the atoms (i.e., the photoelectric effect does not take place at blue layer 170 nor at green layer 168, since red photon 218 does not posses enough energy to excite the atoms of either blue layer 170 or green layer 168). Red layer 166 absorbs red photon 218. A respective red electron 212 and a respective red hole 210 (i.e., an electron and a hole having energy similar to that of red photon 218) are generated by the photoelectric effect. Red electron 212 travels towards electrode 162 by the electric field applied by the P-I-N junction. Red hole 210 travels towards electrode 174 by the magnetic field applied by the P-I-N junction.

It is noted, that the energy gap between valence band 214 and conductance band 216 is larger at the P-type layer (i.e., layer 172, FIG. 5) than at the N-type layer (i.e., layer 164, FIG. 5). The energy gap of each of the GaN layers of FIG. 5 (i.e., blue, green, and red layers, 170, 168, and 166, respectively) is different. The GaN layers are arranged according to their energy gap, from the higher energy gap of the blue layer to the lower energy gap of the red layer (i.e., the bandgap width of the layers of the I-zone is gradually decreasing towards the electrode located away from the solar radiation).

It will be appreciated by persons skilled in the art that the disclosed technique is not limited to what has been particularly shown and described hereinabove. Rather the scope of the disclosed technique is defined only by the claims, which follow.

The invention claimed is:

1. Solar system for converting solar radiation into electric energy, the system comprising:

a refraction array including at least one refraction sub array, each of said refraction sub arrays including a plurality of refraction sites, each of said refraction sites refracting variable approach angle collimated solar radiation into a plurality of refracted rays, each of said refracted rays being of a different waveband, each of said refraction sites directing each of said refracted rays, refracted thereby, in a different direction, said different direction being at least dependent on said approach angle of said solar radiation; and a converting array including a plurality of broadband converting cells, positioned such that light refracted by said refraction array impinges on said converting array, wherein each of broadband converting cells can convert each of said plurality of refracted rays, wherein at a first approach angle of said solar radiation a selected one of said refraction sites directing said refracted rays toward a first group of said broadband converting cells, and at a second approach angle of said solar radiation said selected one of said refraction sites directing said refracted rays toward a second group of said broadband converting cells, said first group of said broadband converting cells including at least one of said broadband converting cells which is not included in said second group of said broadband converting cells, and said second group of said broadband converting cells including at least one of said broadband converting cells which is not included in said first group of said broadband converting cells.

2. The system according to claim 1, wherein all of said at least one refraction sub array are identical.

3. The system according to claim 1, wherein each of said refraction sub array is a prism array, said prism array including a plurality of prisms, each of said prisms having a different internal angle.

4. The system according to claim 1, wherein said refraction array is constructed of a grated surface.

5. The system according to claim 1, wherein said refraction sub array is constructed of a plurality of layers, each of said layers having a refraction index different than the neighboring layer, and wherein said layers are ordered according to the refraction index thereof.

6. The system according to claim 1, wherein said plurality of broadband converting cells are selected from the list consisting of:

photovoltaic PN junction broadband converting cells;
photovoltaic PIN junction broadband converting cells;
photovoltaic tandem broadband converting cells;
photovoltaic multi-junction converting cells; and
excitonic-based converting cells.

7. The system according to claim 1, wherein said plurality of broadband converting cells include quantum wells.

8. The system according to claim 1, wherein said plurality of broadband converting cells include quantum dots.

9. The system according to claim 6, wherein said PIN junction broadband converting cells include an I zone of a gradual stepwise bandgap width, decreasing towards the electrode located away from sun light.

10. The system according to claim 1, wherein said plurality of PV cells is constructed of at least one material selected from the group consisting of:

a crystalline material;
an amorphous material;
an organic synthetic material; and
a mixed phase material.

11. The system according to claim 1, wherein said refracting array and said converting array are coupled there between, such that they form a single structure.

12. The system according to claim 1, further comprising a transparent medium positioned between said refraction array and said converting array.

13. The system according to claim 1, wherein said solar radiation is either impinging on said refracting array directly or is reflected on said refracting array.

* * * * *